July 13, 1965 I. F. BARDITCH ET AL 3,195,070

WIDE BAND SIGNAL SOURCE SYSTEM

Filed Sept. 6, 1961

INVENTORS
Irving F. Barditch, Charles G. Brooks
and Roland G. Lascola
BY Maury I. Hull
ATTORNEY United States Patent Office 3,195,070 Patented July 13, 1965

3,195,070

WIDE BAND SIGNAL SOURCE SYSTEM

Irving F. Barditch, Charles G. Brooks, and Roland G. Lascola, Baltimore, Md., assignors to Westinghouse Electric Corporation, East Pittsburgh, Pa., a corporation of Pennsylvania Filed Sept. 6, 1961, Ser. No. 136,322
4 Claims. (Cl. 331—52)

Figures 1, 2:
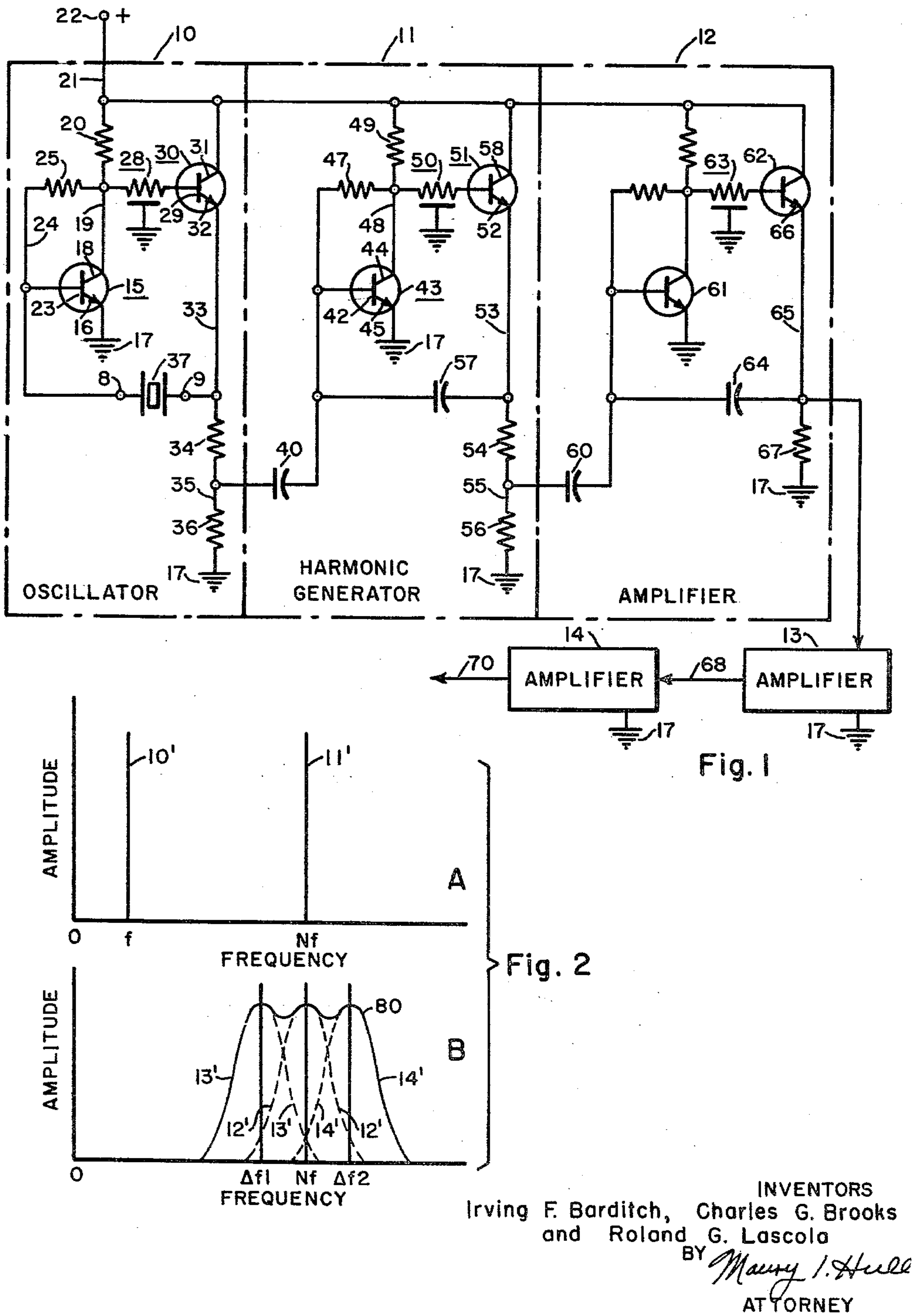

This invention relates to improvements in variable frequency signal sources, and more particularly to a variable frequency signal source employing no inductors and suitable for construction in monolithic form.

In variable frequency signal sources employing an oscillator followed by amplifier stages, where the frequency of the oscillator is changed, it has usually been necessary to retune or adjust the amplifier stages, and as can readily be seen, such an arrangement calls for a complicated and time consuming adjustment every time the oscillator frequency is changed, as by substituting a different crystal for one previously in the circuit.

In conventional circuits employing electron discharge tubes it has been the practice to load the amplifier stages as by resistors connected across the tuned inductors to provide the effect of a bandpass, so that the frequency of the oscillator could be shifted within certain limits without necessitating retuning the amplifier stages. However, heretofore it has been impossible to provide a semiconductor oscillator-amplifier arrangement which permitted broad tuning of amplifier stages which would give usable gain over a number of spaced oscillator frequencies.

In summary, the apparatus of the instant invention includes a semiconductor oscillator utilizing the low impedance of a selected crystal at series resonance in a feedback path to provide for positive feedback and the generation of oscillations. The output of the oscillator, or a harmonic thereof, is fed through a series of cascaded semiconductor amplifiers, each tuned or peaked at a slightly different frequency, to provide a bandpass effect and amplification of a signal of any one of a number of closely spaced different crystal frequencies within the bandpass.

Accordingly, a primary object of the instant invention is to provide a new and improved semiconductor oscillator-amplifier circuit in which the frequency of the oscillator may be changed within limits without necessitating readjustment or retuning of the amplifier stages.

Another object is to provide a new and improved source of variable frequency radio frequency energy suitable for construction in monolithic form.

These and other objects will become more clearly apparent after a study of the following specification, when read in connection with the accompanying drawings, in which:

FIGURE 1 is a schematic electrical circuit diagram of apparatus according to the preferred embodiment of the invention; and FIG. 2 is a pair of graphs to substantially the same frequency scale illustrating the operation of the apparatus of FIG. 1.

For clarity of illustration, FIG. 1 is shown as having discrete circuit components such as resistors, transistors, capacitors, distributed R-C networks, etc., but it should be understood that all of the components or circuit elements of FIG. 1 except the quartz crystal may be properly doped regions of one semiconductor block, in which impurities of the desired types and concentrations are placed in the block to provide the effect of the components and leads, in accordance with well known molecular engineering techniques.

In FIG. 1 the portion 10 generally designates a crystal controlled oscillator. The portion 11 generally designates a harmonic generator which may be, for example, a frequency doubler or frequency quadrupler stage, and the portions 12, 13 and 14 represent tuned amplifier stages, which may be similar to each other except that each amplifier is tuned to a slightly different frequency.

In the oscillator 10 a first transistor 15 is shown having an emitter 16 connected to ground 17. The collector 18 of transistor 15 is connected by way of lead 19, resistor 20 and lead 21 to a terminal 22 connected to a suitable source of direct current energizing potential of proper amplitude and polarity, not shown, having the other terminal thereof connected to ground 17. For ease of illustration, transistor 15 is shown as being an NPN transistor so that in order that the collector and emitter may be properly biased with respect to the base 23 of transistor 15 the terminal 22 should be connected to the positive pole of the source of potential. The base 23 is connected by way of lead 24 and resistor 25 to the aforementioned lead 19, the potential drop across the resistor 25 biasing the base 23 properly with respect to the collector 18 and emitter 16. The aforementioned collector 18 and lead 19 are connected by way of a distributed R-distributed C network generally designated 28 to the base 29 of an additional transistor 30. Semiconductor R-C networks are well known in the art; for example, reference may be had to an article entitled "Distributed Parameter Networks for Microminiaturization," Electrical Manufacturing, April 1960, pp. 92–96 inc., for a more complete understanding of the operation of the semiconductor R-C phase shift network 28. The collector 31 of transistor 30 is connected to the aforementioned lead 21 and the emitter 32 is connected by way of lead 33, resistor 34, lead 35 and resistor 36 to ground 17. The aforementioned lead 33 is connected by way of a frequency controlling crystal 37, which may be a conventional quartz crystal, connected at ohmic contact 8 to the aforementioned lead 24 and base 23, and connected at ohmic contact 9 to lead 33 and emitter 32. The series-resonant frequency of the crystal is used in controlling the frequency of the oscillator circuit in a manner which will be more fully set forth hereinafter.

In the circuit of the oscillator 10 it will be noted that the transistor 15 is connected as a conventional grounded-emitter transistor, and the signal applied to the base, neglecting high frequency effects, may be expected to undergo a phase shift of 180° with respect to the signal developed in the collector load. This signal on lead 19 undergoes a further phase shift in the frequency sensitive phase shift network 28 and may undergo a phase shift of substantially 180° in the network 28, as will be readily understood by those skilled in the art. The output of the R-C network 28 is applied to transistor 30 which it will be seen is connected as an emitter-follower, and again neglecting high frequency effects, no substantial phase shift takes place in the transistor 30, so that the total phase shift in the circuit between lead 24 and lead 33 is substantially 360° for a signal of a certain frequency. As will be readily understood, the signal on lead 33, applied back to the base 23, is in the proper phase relationship to provide for the generation of oscillations in the circuit. The crystal 37 offers a very small impedance to signals having a frequency corresponding to the series-resonant frequency of the crystal, and signals of this frequency are fed back to the base 23 in sufficient amplitude to cause the generation of oscillations. The circuit is highly frequency selective and highly stable because of the effect of very high Q of the crystal 37. For a fuller understanding of the effect of obtaining positive feedback in a circuit of this type reference may be had to a copending application by Barditch and Fogle entitled "Delay Cable Tuned Semiconductor Amplifiers Suitable for Partial Molecularization," Serial No. 80,877, filed January 5, 1961 and assigned to the assignee of the instant invention.

The output of the oscillator 10 is applied to a harmonic generator 11; it is taken from lead 35 and is supplied by way of capacitor 40 and lead 41 to the base 42 of a transistor generally designated 43 having a collector 44 and emitter 45 connected to ground 17. Lead 41 is connected by way of resistor 47, lead 48 and resistor 49 to the aforementioned power supply lead 21. Lead 48 and the collector 44 of transistor 43 are coupled by way of a frequency sensitive phase shift device 50, which may be similar to device 28, to an emitter-follower transistor 51 which has the emitter 52 thereof connected by way of lead 53, resistor 54, lead 55 and resistor 56 to ground 17. The feedback capacitor 57 connects lead 53 to the aforementioned lead 41. Collector 58 is connected to lead 21.

The operation of the harmonic generator 11 is somewhat similar to the operation of the oscillator 10. A closed feedback loop is formed through the two transistors 43 and 51, device 50, and the capacitor 57; by suitable choice of component values, in accordance with the frequency at which the phase shift network 50 provides for 360° phase shift between lead 53 and lead 41, the circuit 11 may serve as a frequency multiplier or harmonic generator, receiving its excitation from oscillator 10.

The output of the harmonic generator 11, which harmonic generator may be eliminated if desired, is supplied by way of coupling capacitor 60 to a tuned amplifier stage 12 which is similar to stage or circuit 11 and includes transistors 61 and 62, frequency sensitive phase shift device 63 and coupling capacitor 64. Lead 65 interconnects the emitter 66 of transistor 62 with the capacitor 64, and is connected by way of resistor 67 to ground 17, and lead 65 is further connected to supply an output which provides an input to an additional amplifier stage 13, which may be similar to stage 12, except that it is tuned to provide maximum amplification for a different and closely related frequency. The output of amplifier stage 13 is applied by way of lead 68 to a third amplifier stage 14, which may be similar to stage 12 except that it is tuned to provide maximum amplification for a signal of a frequency different from that of the amplifier 12, and also different from that of the amplifier 13, but closely related to the frequency of both of the amplifiers 12 and 13. The output of amplifier 14 is developed on output lead 70 with respect to ground.

Particular reference is made now to FIG. 2, where the amplitudes of the signals in the oscillator, frequency multiplier and amplifier stages are plotted as a function of frequency, as well as the response curves of amplifiers 12, 13, and 14. Graphs A and B are to substantially the same frequency scale. The oscillator 10 is seen to develop a signal of great amplitude at a single frequency "*f*," indicated by the graph or curve 10' in FIG. 2, as controlled by the series-resonant frequency of crystal 37. At a higher frequency the harmonic generator 11, if employed generates a single frequency "N*f*" which is a multiple of frequency "*f*," the output of the harmonic generator being indicated by the curve 11'. The response curve of tuned amplifier 12, which it is understood does not provide sufficient feedback to permit the circuit to break into oscillation, is shown by the curve 12' of FIG. 2. It may have its maximum or peak response at frequency "N*f*." As will be readily understood, the tuned amplifier 12, in accordance with the teachings of the copending referenced patent application, has its maximum response at a frequency at which the signal fed back to the base of transistor 61 undergoes a phase shift of exactly 360° in the transistors and phase shift device, and that for frequencies above and below this frequency of maximum transmission, the response of the amplifier 12 falls off, the steepness of the response curve depending upon the effective "Q" of the circuit.

The response curve of the amplifier 13 is shown in FIG. 2 by the curve 13' and may be, for example, most responsive, or amplify with least attenuation, a signal of a frequency $\Delta f1$ slightly below the frequency N*f* to which the amplifier 12 is tuned.

The output of the amplifier 13, as developed on lead 68 as aforementioned is applied to amplifier 14 which by suitable choice of component values and the distributed R-distributed C network 63 therein may be most responsive to signals of a frequency $\Delta f2$ slightly higher than the frequency N*f*, the response of the amplifier 14 being shown in FIG. 2 by the curve 14'. It will be seen that the response curves of the three amplifiers overlap to provide a somewhat idealized overall response curve 80 in FIG. 2. The shape of curve 80 is in effect a bandpass curve and results from the fact that whereas for example a signal of frequency $\Delta f1$ to which amplifier 13 is most responsive is amplified in amplifier 13 to a great extent, it is amplified to a much lesser extent in the amplifier 12 and is not amplified at all in the amplifier 14. A similar relationship applies to signals of frequency $\Delta f2$ to which amplifier 14 is most responsive. There results then a total response curve for the three cascaded amplifier stages which gives in effect a substantially flat bandpass characteristic.

From the above, it will be seen that the feedback circuits of each amplifier after the harmonic generator 11 constitutes a part of a circuit path which also includes the coupling capacitors for the amplifier stages. Thus, it is apparent from the drawings and the previous description that the full bandwidth from the harmonic generator is supplied directly to each amplifier. The amplifiers may be considered to be in a series-parallel cascade arrangement whereby each amplifier amplifies the band of frequencies to which it is tuned and then supplies its output to the total output of the system. It will be seen that the frequency of the oscillator may be changed as by substituting crystals at 37 so that the output of the harmonic generator 11 falls anywhere within the bandpass 80 provided by the cascaded amplifier stages, and that to obtain full output from the oscillator-amplifier combination, no adjustment of the tuning of the amplifier stages is necessary, and that frequency shifting may be accomplished solely by changing the frequency of the oscillator as by changing or substituting a different crystal at 37.

If desired, as is obvious, the response curve 80 can be altered somewhat by making the amplifiers 14 and 13 have gains in excess of the gain of amplifier 12, and the invention includes the use of any desired relative gains in the various cascaded amplifier stages to obtain a bandpass response of desired characteristics.

Any desired number of cascaded stages may be employed.

As previously stated, the entire apparatus, apart from the crystal 37, may be manufactured in a single block of semiconductor material, crystal 37 being connected across a pair of ohmic contacts 8 and 9 on the outer surface of the semiconductor block, the transistors, resistors, leads, capacitors and phase shift networks being provided inside the semiconductor block by suitable doping of regions with impurities of the correct type, concentration, and position, as will be readily understood by those skilled in the art.

Whereas the invention has been shown and described with reference to a detachable crystal connected to a semiconductor block as at ohmic contacts 8 and 9, a bank of crystals of slightly different frequencies could be connected to switch means for selecting a particular crystal to be connected in circuit.

For the purpose of the claims appended hereto, the term, "oscillator" may include both oscillator 10 and frequency multiplier 11.

Whereas the invention has been shown and described with respect to an embodiment thereof which gives satisfactory results, it should be understood that changes may be made and equivalents substituted without departing from the spirit and scope of the invention.

We claim as our invention:

1. A wide band source of radio frequency comprising a plurality of semiconductor signal translation stages connected in cascade, each of said stages including a transistor connected as a grounded emitter and distributed RC means for shifting the phase of a selected band of frequencies by 360° between the input and the output of the respective stages, all of said stages having a feedback circuit between the input and the output of the stage to provide selective regenerative feedback for the selected band of frequencies, the feedback circuit of said first stage including a piezoelectric crystal for providing a low impedance path for signals of the series-resonant frequency of said crystal, each of the other stages being tuned to different frequency bands the respective center frequencies of which are displaced from each other but have their gain-vs.-frequency response characteristics overlapping to provide the effect of a bandpass characteristic.

2. A wide band source of radio frequency comprising a plurality of semiconductor signal translation stages connected in cascade, each of said stages having two transistor devices one of which is connected as a grounded emitter, and including distributed RC means for shifting the phase of a selected band of frequencies of 360° between the input and the output of the stage, all of said stages having a feedback circuit between the output and the input of the stage to provide a selective regenerative feedback for the selected bands of frequencies of the respective stages, the feedback circuit for the first of said stages including a piezoelectric crystal for providing a low impedance path for signals of the series-resonant frequency of said crystal, each of the other stages being tuned to different frequency bands the respective center frequencies of which are displaced from each other but have their gain-vs.-frequency response characteristics overlapping to provide the effect of a bandpass characteristic.

3. A wide band source of radio frequency comprising a plurality of semiconductor signal translation stages connected in cascade, each of said stages comprising a transistor connected as a grounded emitter and means including a second transistor connected as an emitter-follower for shifting the phase of a selected band of frequencies by 360° between the input and the output, a feedback loop from the output of the second transistor of each stage to the input of the respective stage to determine the bandpass characteristic of the stage, the feedback circuit of the first stage including a piezoelectric crystal for providing a low impedance path for signals of the series-resonant frequency of said crystal, each of the other stages being tuned to different frequency bands, the respective center frequencies of which are displaced from each other but have their gain-vs.-frequency response characteristics overlapping to provide the effect of a bandpass characteristic.

4. A wide band source of radio frequency comprising a plurality of semiconductor signal translation stages connected in cascade, each of said stages comprising a pair of transistors and a frequency sensitive phase shift means, the first of each pair of transistors of each stage being connected as a grounded emitter with the frequency sensitive phase shift means being connected between the collector output of said first stage and the base of the second transistor which is connected as an emitter-follower, each of said stages providing a 360° phase shift between the input and output of the stages for a selected band of frequencies, each of said stages having a feedback circuit between the output and the input of the respective stages to provide selected regenerative feedback for the selected band of frequencies, the feedback circuit of the first stage including a piezoelectric crystal for providing a low impedance path for signals of the series-resonant frequency of said crystal, the other of said stages being tuned to respective bands of frequencies different from that of said first stage, the respective center frequencies of which are displaced from each other but have portions of their gain-vs.-frequency response characteristics overlapping to provide the effect of a bandpass characteristic.

References Cited by the Examiner

UNITED STATES PATENTS

| | | | |
|---|---|---|---|
| 1,955,094 | 4/34 | Runge et al. | 331—76 |
| 2,070,647 | 2/37 | Braaten | 331—159 |
| 2,942,199 | 6/60 | Lee | 330—21 |
| 3,054,072 | 9/62 | Beaulieu et al. | 331—135 |
| 3,054,969 | 9/62 | Harrison | 331—76 |

ROY LAKE, *Primary Examiner.*

JOHN KOMINSKI, *Examiner.*